(12) United States Patent
Hung et al.

(10) Patent No.: US 8,330,227 B2
(45) Date of Patent: Dec. 11, 2012

(54) INTEGRATED SEMICONDUCTOR STRUCTURE FOR SRAM AND FABRICATION METHODS THEREOF

(75) Inventors: Sheng Chiang Hung, Hsinchu (TW); Huai-Ying Huang, Jhonghe (TW); Ping-Wei Wang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 248 days.

(21) Appl. No.: 12/706,809

(22) Filed: Feb. 17, 2010

(65) Prior Publication Data

US 2011/0198699 A1 Aug. 18, 2011

(51) Int. Cl.
*H01L 21/70* (2006.01)

(52) U.S. Cl. ........ 257/369; 257/310; 257/347; 257/371; 257/384; 438/216; 438/217; 438/283; 438/287

(58) Field of Classification Search .......................... None
See application file for complete search history.

(56) References Cited

U.S. PATENT DOCUMENTS

| | | | |
|---|---|---|---|
| 5,135,882 A | 8/1992 | Karniewicz | |
| 6,573,134 B2 | 6/2003 | Ma et al. | |
| 2005/0045965 A1 | 3/2005 | Lin et al. | |
| 2006/0105515 A1 | 5/2006 | Amos et al. | |
| 2007/0040225 A1 | 2/2007 | Yang | |
| 2007/0048946 A1* | 3/2007 | Ramaswamy et al. | 438/283 |
| 2008/0029822 A1 | 2/2008 | Tsuchiya et al. | |
| 2009/0321843 A1 | 12/2009 | Waite et al. | |

* cited by examiner

*Primary Examiner* — Kyoung Lee
(74) *Attorney, Agent, or Firm* — Haynes and Boone, LLP

(57) ABSTRACT

A SRAM device with metal gate transistors is provided. The SRAM device includes a PMOS structure and an NMOS structure over a substrate. Each of the PMOS and the NMOS structure includes a p-type metallic work function layer and an n-type metallic work function layer. The p-type work metallic function layer and the n-type metallic work function layer form a combined work function for the PMOS and the NMOS structures.

20 Claims, 9 Drawing Sheets

INTEGRATED SEMICONDUCTOR STRUCTURE FOR SRAM AND FABRICATION METHODS THEREOF

RELATED APPLICATIONS

The present disclosure is related to the following commonly-assigned U.S. patent applications, the entire disclosures of which are incorporated herein by reference: U.S. application Ser. No. 61/186,628 for "METAL GATE TRANSISTOR, INTEGRATED CIRCUITS, SYSTEMS, AND FABRICATION METHODS THEREOF".

TECHNICAL FIELD

The present disclosure relates generally to the field of semiconductor devices, and more particularly, to metal gate transistors, integrated circuits, systems, and fabrication methods thereof.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

During the scaling trend, various materials have been implemented for the gate electrode and gate dielectric for CMOS devices. CMOS devices have typically been formed with a gate oxide and polysilicon gate electrode. There has been a desire to replace the gate oxide and polysilicon gate electrode with a high dielectric constant (high-k) gate dielectric and metal gate electrode to improve device performance as feature sizes continue to decrease.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
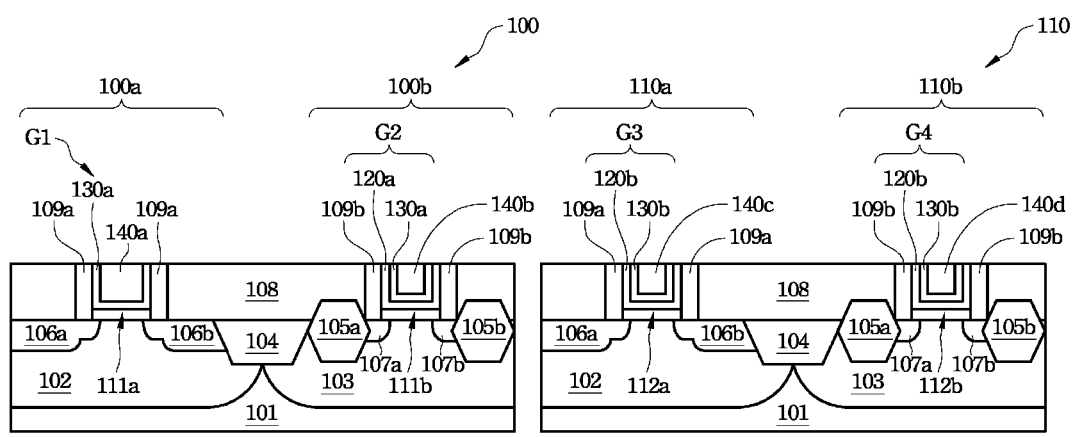
FIG. 1 is a schematic cross-sectional view illustrating an exemplary integrated circuit including a P-type transistor and an N-type transistor.

Conventionally, techniques for forming the metal gate electrode can be cataloged as gate-first processes and gate-last processes. For a gate-first process, the metal gate electrode is formed before formation of source/drain regions of the transistors. A gate-last process forms the source/drain regions within the substrate and a dummy gate within an interlayer dielectric (ILD). The dummy gate is removed and an opening is formed within the ILD. The metal gate electrode is then filled within the opening. The gate-first and gate-last processes can be used to form metal gate complementary metal-oxide-semiconductor (CMOS) transistors in logic devices and/or static random access memory (SRAM) devices.

A logic device comprises a metal gate CMOS transistor including a metal gate PMOS transistor and a metal gate NMOS transistor. The metal gate PMOS transistor in a logic device includes an n-type work function material disposed on the p-type work function material. The metal gate NMOS transistor in a logic device includes a single n-type work function material by removing the previously formed p-type work function material. A SRAM device, following the same design of the metal gate PMOS and NMOS transistors, comprises metal gate PMOS and NMOS transistors with different work functions because of the different work function materials therein. A conductive material may be formed on the CMOS transistor for an electrical transmission.

As noted, the gate-last process removes the dummy gates for forming recesses for accommodating the metal gate electrodes. The p-type work function material is formed within the recesses of metal gate PMOS and NMOS transistors. Thereafter, before depositing an n-type work function material, the part of p-type work function material in the metal gate NMOS transistor is removed by patterning and etching processes. It is found that SRAM device has a tighter process constrain than in logic device. Hence, the step of removal of the p-type work function material in NMOS transistor increases process complexity and/or uncertainty. If the fabrication technique shrinks, e.g., about 22 nm manufacturing process or less, it is found difficult to ensure well process control on the step of removing p-type work function material in NMOS transistor.

Additionally, there is a need of high implantation dosages for formation of well and/or halo regions in the SRAM devices with different work function materials in metal gate PMOS and NOMS transistors. The higher implantation dosages may induce heavy channeling effect. Moreover, the higher implantation dosages may increase the non-uniform of dopant distribution within device and increases the fluctuation of threshold voltage (Vt) of device.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.)

are used for ease of the present disclosure of one features relationship to another feature. The spatially relative terms are intended to cover different orientations of the device including the features.

FIG. 1 is a schematic cross-sectional view illustrating an exemplary integrated circuit including a logic device 100 and/or a SRAM device 110. The logic device 100 includes a N-type transistor (NMOS) 100a and a P-type transistor (PMOS) 100b, and the SRAM device 110 includes a N-type transistor (NMOS) 110a and a P-type transistor (PMOS) 110b, over a substrate 101.

In some embodiments, the substrate 101 can include an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

Referring to FIG. 1, the logic device 100 and the SRAM device 110 each includes a P-well region 102 and a N-well region 103 formed within the substrate 101. The P-well regions 102 and the N-well regions 103 can be configured to provide channel regions of the NMOS 100a/110a and the PMOS 100b/110b. The P-well regions 102 and the N-well regions 103 in the logic device 100 and the SRAM device 110 can have a dopant concentration less than $5.7 \times 10^{13}$ atoms/cm$^2$.

The logic device 100 and the SRAM device 110 each includes an isolation structure 104 disposed between the NMOS 100a/110a and the PMOS 100b/110b, respectively. The isolation structures 104 can insulate the NMOS 100a/110a from the PMOS 100b/110b, respectively. In some embodiments, the isolation structures 104 can be shallow trench isolation (STI) structures, local oxidation of silicon (LOCOS) structures, or other isolation structures.

In some embodiments, the PMOS 100b/110b each includes silicon-germanium (SiGe) structures 105a and 105b disposed adjacent to p-type source/drain regions 107a and 107b, respectively. The p-type source/drain regions 107a and 107b can be disposed adjacent to the channel regions of the PMOS 100b/110b. The NMOS 100a/110a each includes n-type source/drain regions 106a and 106b disposed adjacent to the channel regions of the NMOS 100a/110a.

In some embodiments, the n-type source/drain regions 106a and 106b can have dopants such as Arsenic (As), Phosphorus (P), other group V element, or the combinations thereof. The p-type source/drain regions 107a and 107b can have dopant such as Boron (B) or other group III element. In other embodiments, the source/drain regions can include silicide for low resistances. The silicide may comprise materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable silicide compounds, and/or combinations thereof. The materials utilized to create the silicide may be deposited using PVD such as sputtering and evaporation; plating; CVD such as plasma enhanced CVD (PECVD), atmospheric pressure CVD (APCVD), low pressure CVD (LPCVD), high density plasma CVD (HDPCVD) and atomic layer CVD (ALCVD); other suitable deposition processes; and/or combinations thereof. After deposition, the salicidation process may continue with a reaction between the deposited material and the doped regions at an elevated temperature that is selected based on the specific material or materials. This is also referred to as annealing, which may include an RTP. The reacted silicide may be formed by a one-step RTP or multiple-step RTPs.

Referring again to FIG. 1, at least one dielectric layer 108 can be disposed over the substrate 101. The dielectric layer 108 may include materials such as oxide, nitride, oxynitride, low-k dielectric material, ultra low-k dielectric material, extreme low-k dielectric material, other dielectric material, and/or combinations thereof. The dielectric layer 108 may be formed by, for example, a CVD process, a HDP CVD process, a HARP, a spin-coating process, other deposition process, and/or any combinations thereof. In some embodiments, the dielectric layer 108 can be referred to as an interlayer dielectric (ILD). In other embodiments, additional dielectric layer (not shown) can be formed below or over the dielectric layer 108.

In some embodiments, spacers 109a and 109b can be disposed adjacent to gate structures of the NMOS 100a/110a and PMOS 100b/110b, respectively. The spacers 109a and 109b may include materials such as oxide, nitride, oxynitride, and/or other dielectric material.

As described above, the logic device 100 includes the NMOS 100a and the PMOS 100b over the P-well region 102 and the N-well region 103, respectively. The NOMS 100a can include a gate dielectric 111a disposed over the P-well region 102. A metal gate G1 can be disposed over the gate dielectric 111a. The metal gate G1 includes a first work function metallic layer 130a which can be configured to adjust a work function value of the metal gate G1. The first work function metallic layer 130a, for example, is an n-type work function metallic layer. The PMOS 100b can include a gate dielectric 111b disposed over the N-well region 103. A metal gate G2 can be disposed over the gate dielectric 111b. The metal gate G2 includes a second work function metallic layer 120a disposed under the first work function metallic layer 130a. The second work function metallic layer 120a, for example, is a p-type work function metallic layer. The first and the second work function metallic layers 130a, 120a can form a combined work function to adjust a work function value of the metal gate G2.

As described above, the SRAM device 110 includes the NMOS 110a and the PMOS 110b over the P-well region 102 and the N-well region 103, respectively. The NMOS 110a can include a gate dielectric 112a disposed over the P-well region 102. A metal gate G3 can be disposed over the gate dielectric 112a. The metal gate G3 includes a third work function metallic layer 130b over a fourth work function metallic layer 120b. The PMOS 110b can include a gate dielectric 112b disposed over the N-well region 103. A metal gate G4 can be disposed over the gate dielectric 112b. The metal gate G4, in one embodiment, comprises the third work function metallic layer 130b over the fourth work function metallic layers 120b. The third and the fourth work function metallic layers 130b, 120b can form a combined work function to adjust work function values of the third metal gate G3 and the fourth metal gate G4.

In one embodiment, the third work function metallic layers 130b is an n-type work function metallic layer and the fourth work function metallic layer 120b is a p-type work function metallic layer. In another embodiment, the third work function metallic layers 130b is a p-type work function metallic layer and the fourth work function metallic layer 120b is an n-type work function metallic layer.

In one embodiment, the material of the first work function metallic layer 130a is the same as the material of the third work function metallic layer 130b. In another embodiment, the material of second work function metallic layer 120a is the same as the material of the fourth work function metallic layer 120b. In yet another embodiment, the materials of the first and the second work function metallic layers 130a, 120a are the same as the materials of the third and the fourth work function metallic layers 130b, 120a, respectively.

Conductor structures 140a, 140b, 140c, and 140d can be disposed over the first, the second, the third, and the fourth metal gates G1, G2, G3, and G4, respectively. The conductor structures 140a, 140b, 140c, and 140d can be configured to provide an electrical transmission. The conductor structures 140a, 140b, 140c, and 140d can include structures, such as lines, bulks, plug, and/or other shape of structures. In some embodiments, the conductor structures 140a, 140b, 140c, and 140d can include metal (e.g., Al) or silicide such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), titanium silicide (TiSi), other suitable materials, and/or the combinations thereof.

Referring again to FIG. 1, each of the gate dielectrics 111a, 111b, 112a, and 112b can be a single layer or a multi-layer structure. In some embodiments, each of the gate dielectrics 111a, 111b, 112a, and 112b can include an interfacial layer, e.g., a silicon oxide layer and a high-k dielectric layer disposed over the interfacial layer. In some embodiments, the high-k dielectric layer may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, and/or combinations thereof. The high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, other suitable materials, and/or combinations thereof. The high-k dielectric layer may be formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof.

The first and the third work function metallic layers 130a and 130b can include materials such as metal, metal carbide, metal nitride, or other suitable materials. In some embodiments, the first and the third work function metallic layers 130a and 130b can include materials such as hafnium, zirconium, titanium, tantalum, aluminum, metal carbides, other suitable materials, or the combinations thereof. In other embodiments, the first and the third work function metallic layers 130a and 130b can include TiAl. The first and the third work function metallic layers 130a and 130b are capable of providing a work function value of about 4.4 eV or less. In some embodiments, the first and the third work function metallic layers 130a and 130b can have a bottom thickness of about 30 Å.

The second and the fourth work function metallic layers 120a, 120b can include materials such as metal, metal carbide, metal nitride, other materials that can provide a desired work function for transistors. In some embodiments, the second and the fourth work function metallic layers 120a, 120b can include a conductive metal, such as ruthenium, palladium, platinum, cobalt, nickel, conductive metal oxides, e.g., ruthenium oxide, other suitable materials, or the combinations thereof. In other embodiments, the second and the fourth work function metallic layers 120a, 120b can include TiN. The second and the fourth work function metallic layers 120a, 120b are capable of providing a work function value of about 4.8 eV or more. In some embodiments, the second and the fourth work function metallic layers 120a, 120b can have a bottom thickness of about 100 Å or less. In other embodiments using a 25-nm technique, the second and the fourth work function metallic layers 120a, 120b can have a bottom thickness of about 30 Å.

The first and the second work function metallic layers 130a, 120a may form a combined work function value for the metal gate G2. The third and the fourth work function metallic layers 130b, 120b may form a combined work function value for the metal gates G3 and G4. The combined work function values of the metal gates G2, G3, and G4 are ranging from about 4.4 eV to about 4.8 eV. In some embodiments, each combined work function value of the metal gates G2, G3, and/or G4 is adjusted to be about 4.6 eV. Further, in at least one embodiment that the integrated circuit includes a logic device 100 (or a CMOS device) and a SRAM device 110, a work function of the PMOS 110b of the SRAM device 110 is the same as a work function of the NMOS 110a of the SRAM device 110, and a work function of the PMOS 100b of the logic device 100 is different from a work function of the NMOS 100a of the logic device 100.

It is noted that the structure described above in conjunction with FIG. 1 is merely exemplary. An interconnect structure (not shown) can be formed over the dielectric layer 108 for an electrical connection. The interconnect structure can include various dielectric materials, via structures, metallic lines, single damascene structure, dual damascene structure, passivation, other desired semiconductor structure, and/or combinations thereof.

FIGS. 2A-2L are schematic cross-sectional views illustrating an exemplary process flow for forming a gate-last CMOS transistor. Items of FIGS. 2A-2L that are the same items in FIG. 1 are indicated by the same reference numerals, increased by 100.

Figure 2A:
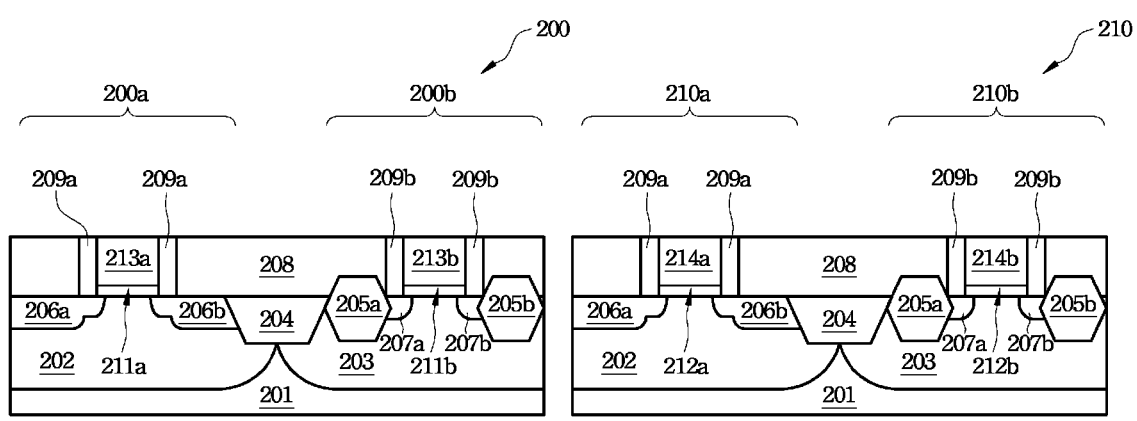
FIGS. 2A-2H are schematic cross-sectional views illustrating an exemplary gate-last process flow for forming an integrated circuit including a CMOS transistor.

Referring to FIG. 2A, a logic device 200 includes a NMOS 200a and a PMOS 200b, and a SRAM device 210 includes a NMOS 210a and a PMOS 210b, over a substrate 201. The NMOS 200a, the PMOS 200b, the NMOS 210a, and the PMOS 210b each has a dummy gate 213a, 213b, 214a, and 214b formed over a gate dielectric 211a, 211b, 212a, and 212b, respectively. In some embodiments, the dummy gates 213a, 213b, 214a, and 214b can include materials such as silicon, polysilicon, amorphous silicon, and other material that has a desired etch rate with respect to a dielectric material 208 and spacers 209a and 209b. The dummy gates 213a, 213b, 214a, and 214b can be formed by deposition, photolithography patterning, etching processes, and/or combinations thereof. The deposition processes may include CVD, ALD, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. The etching processes may include dry etching, wet etching, and/or other etching methods (e.g., reactive ion etching). The etching process may also be either purely chemical (plasma etching), purely physical (ion milling), and/or combinations thereof.

Figure 2B:
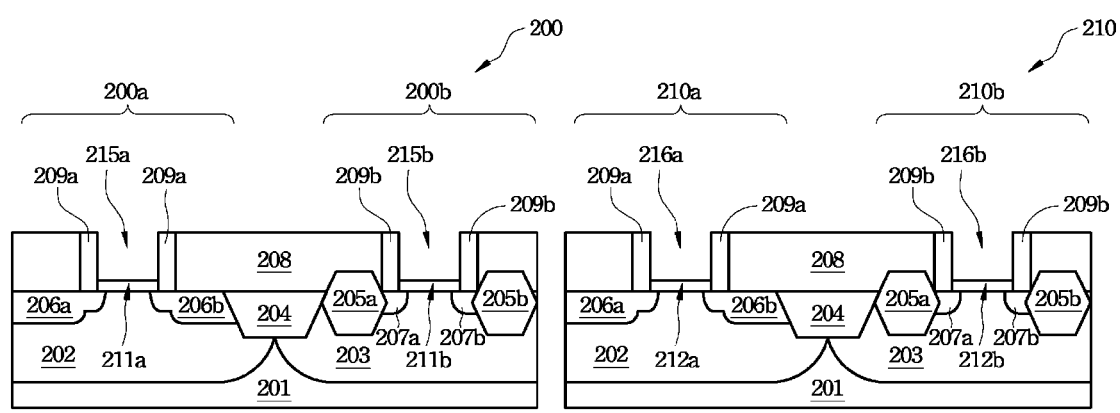

In FIG. 2B, the dummy gates 213a, 213b, 214a, and 214b (shown in FIG. 2A) can be substantially removed to form openings 215a, 215b, 216a, and 216b, respectively. In some embodiments, the dummy gates 213a, 213b, 214a, and 214b can be removed by, for example, a wet etch process, a dry etch process, other removing process, and/or combinations thereof. In some embodiments, the gate dielectrics 211a, 211b, 212a, and 212b can include at least one cap layer (not shown) disposed over the high-k dielectric materials. The cap layer is capable of substantially protecting the high-k dielectric materials from being damaged by the process for removing the dummy gates 213a, 213b, 214a, and 214b. In some embodiments, the cap layer can include materials such as TiN, TaN, other suitable material that can resist the removing process, and/or combinations thereof.

Figure 2C:
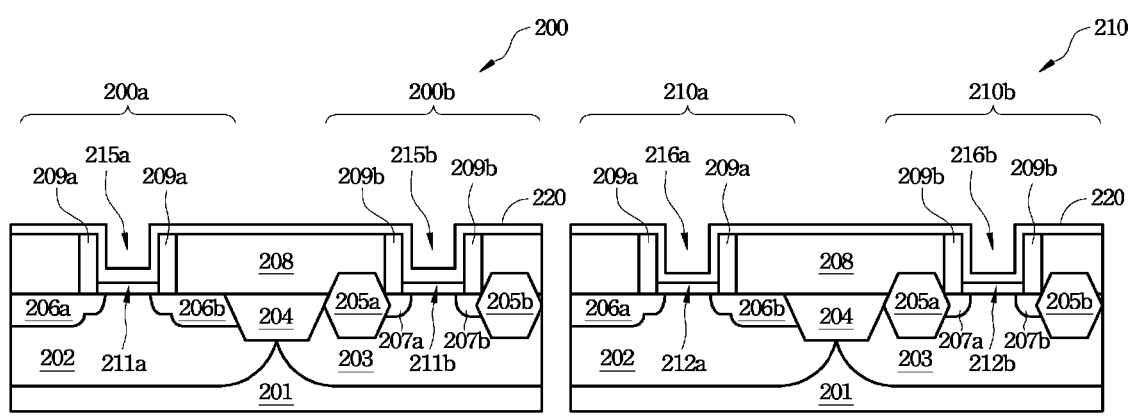

Referring to FIG. 2C, a protection layer (not shown) and a p-type work function material 220 can be formed over the structure shown in FIG. 2B. The protection layer, for example TaN, may protect the underlying structure during a later process of defining the p-type work function metallic layer 220a. In some embodiments, the p-type work function material 220, for example titanium nitride, tantalum nitride, or cobalt, can contribute to desired work function values for gate electrodes of the PMOS 200b, the NMOS 210a, and the PMOS 210b. The protection material and the p-type work function material 220 can be formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof.

Figure 2D:
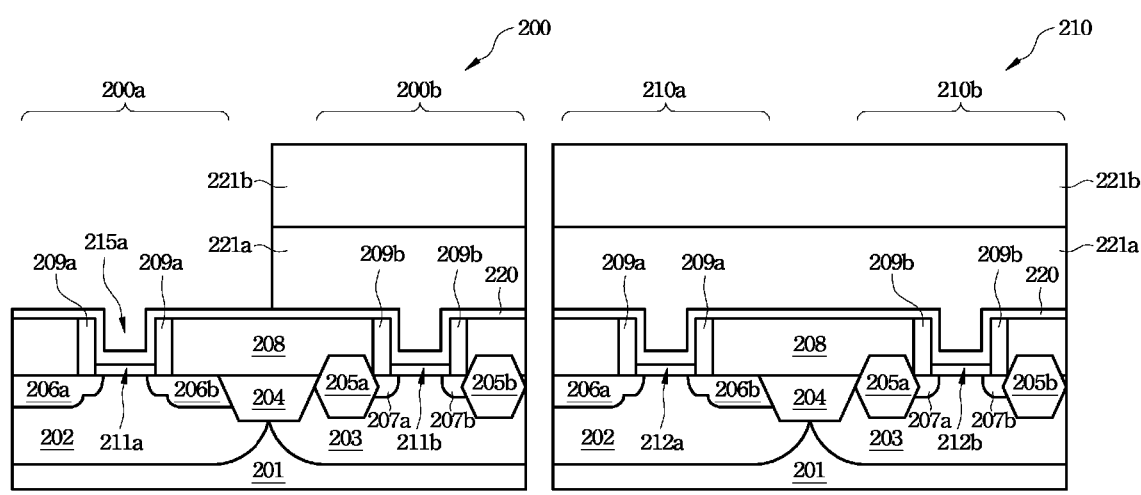

In FIG. 2D, a dielectric material 221a, e.g. spin-on-glass (SOG), can be formed, covering regions of the PMOS 200b, the NOMS 210a, the PMOS 210b, and filling the openings 215b, 216a, and 216b (shown in FIG. 2C). A photoresist 221b can be defined over the dielectric material 221a. The dielectric material 221a and/or the photoresist 221b can be provided for patterning the p-type work function material 220 for the PMOS 200b, the NOMS 210a, and the PMOS 210b. The dielectric material 221a and the photoresist 221b can be defined by, for example, a spin-on process, a photolithographic process, and an etch process.

Figure 2E:
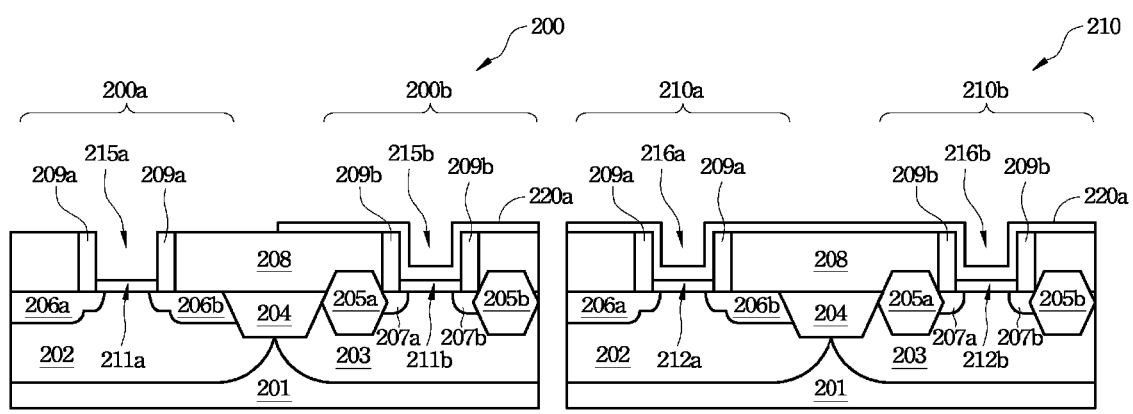

In FIG. 2E, a portion of the p-type work function material 220 that is not covered by the dielectric material 221a and the photoresist 221b (shown in FIG. 2D) can be removed, defining the p-type work function metallic layer 220a. After defining the p-type work function metallic layer 220a, the dielectric material 221a and the photoresist 221b can be removed by a wet etch process, a dry etch process, and/or combinations thereof, exposing the p-type work function metallic layer 220a.

Figure 2F:
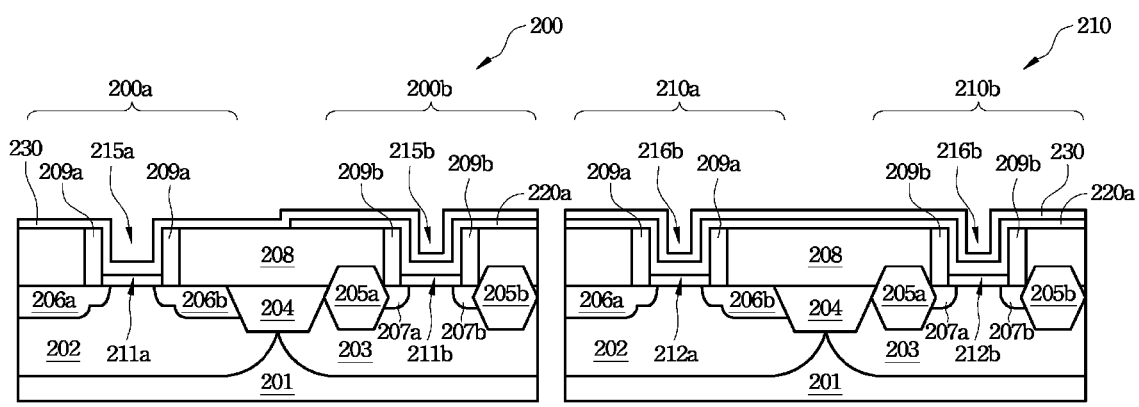

In FIG. 2F, an n-type work function material 230 can be formed over the structure shown in FIG. 2E. The n-type work function material 230, for example titanium, tantalum, aluminum, titanium alloy, tantalum alloy, or aluminum alloy, can provide a desired work function value for the gate electrode of the NMOS 200a, and contribute to desired work function values for gate electrodes of the PMOS 200b, the NMOS 210a, and the PMOS 210b. The n-type work function material 230 can be formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof.

Figure 2G:
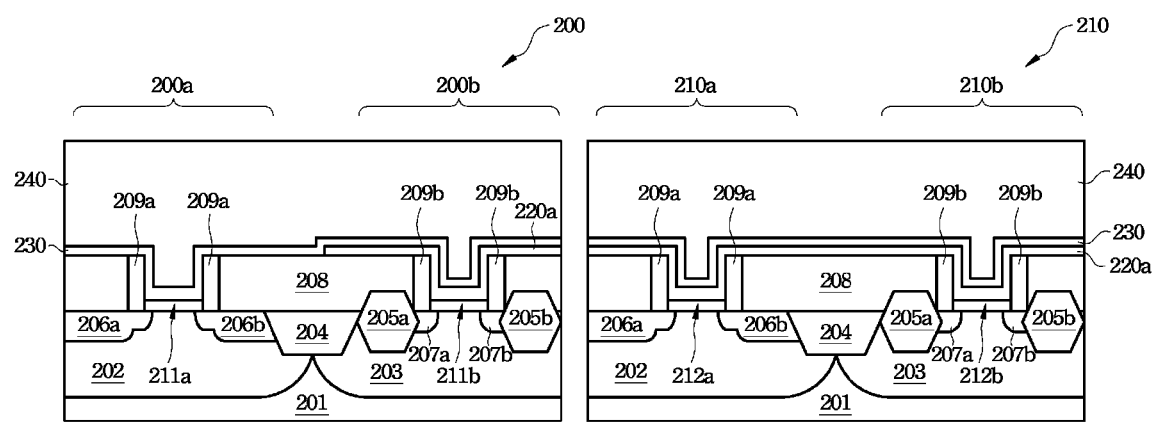

In FIG. 2G, a conducting material 240, e.g., metal (e.g., Al) or silicide such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), titanium silicide (TiSi), other suitable materials, and/or the combinations thereof, can be formed over the NOMS 200a, the PMOS 200b, the NOMS 210a, the PMOS 210b, and filling the openings 215a, 215b, 216a, and 216b (shown in FIG. 2F). The conducting material 240 can be formed by a PVD process or a CVD process such as high-density plasma CVD (HD-PCVD), atomic layer CVD (ALCVD), or the like.

Figure 2H:
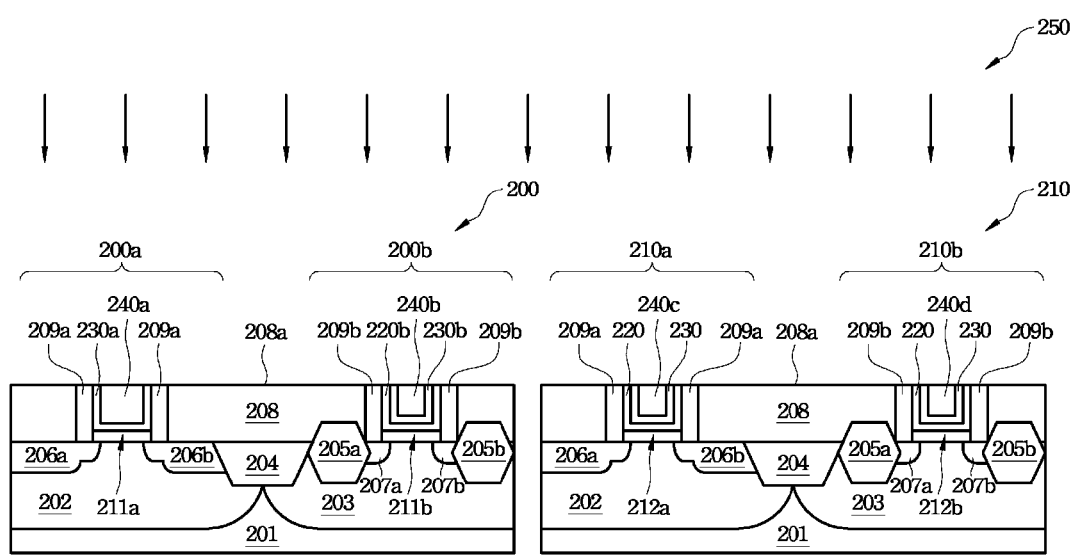

In FIG. 2H, a removing process 250 can remove a portion of the conducting material 240 such that top surfaces (not labeled) of conducting bulks 240a, 240b, 240c, and 240d can be substantially level with a top surface 208a of the dielectric material 208. The conducting bulks 240a, 240b, 240c, and 240d can provide electrical transmission. The removing process 250 can include a chemical-mechanical polish (CMP) process, a dry etch process, a wet etch process, and/or combinations thereof.

It is noted that the method described above in conjunction with FIGS. 2A-2H is merely exemplary. One of skill in the art can modify the flow of the method to achieve desired metal gate transistors. For example, the process forming and defining the dielectric material 221a can be saved if solely using the photoresist 221b to define the p-type work function metallic layer 220a is desired.

In other embodiments, the PMOS 200b is free from including the n-type work function metallic layer 230. In those embodiments, additional photolithographic process, etch process, and/or cleaning process may be used to merely leave the n-type work function metallic layer 230 in the NMOS 200a.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a NMOS structure, comprising, a first gate dielectric overlying a substrate; and a first metal gate overlying the first gate dielectric; and
    a PMOS structure, comprising, a second gate dielectric overlying the substrate; and a second metal gate overlying the second gate dielectric, wherein the work function of the first metal gate and the second metal gate is a combined work function resulted by a p-type work function and an n-type work function.

2. The semiconductor device of claim 1, wherein the device is static random access memory (SRAM).

3. The semiconductor device of claim 1, wherein the first metal gate and the second metal gate each has a work function ranging between about 4.4 eV and about 4.8 eV.

4. The semiconductor device of claim 3, wherein the work function is about 4.6 eV.

5. The semiconductor device of claim 1, wherein the first metal gate comprises a first p-type work function layer and a first n-type work function layer and the second metal gate comprises a second p-type work function layer and a second n-type work function layer.

6. The semiconductor device of claim 5, wherein the first p-type work function layer is the same as the second p-type work function layer and the first n-type work function layer is the same as the second n-type work function layer.

7. The semiconductor device of claim 5, wherein the first p-type work function layer and the second p-type work function layer each has a work function not less than 4.8 eV, the first n-type work function layer and the second n-type work function layer each has a work function not larger than 4.4 eV.

8. The semiconductor device of claim 5, wherein the first and the second p-type work function layers are titanium nitride, tantalum nitride, or cobalt.

9. The semiconductor device of claim 5, wherein the first and the second n-type work function layers are titanium, tantalum, aluminum, titanium alloy, tantalum alloy, or aluminum alloy.

10. The semiconductor device of claim 1 wherein:
the first metal gate includes a first metal layer disposed over the first gate dielectric and a second metal layer disposed over the first metal layer;
the second metal gate includes a third metal layer disposed over the second gate dielectric and a fourth metal layer disposed over the third metal layer, the first metal layer and the third metal layer including a same material and the second metal layer and the fourth metal layer including a same material.

11. The semiconductor device of claim 10 wherein:
the first metal layer and the third metal layer are p-type work function layers; and
the second metal layer and the fourth metal layer are n-type work function layers.

12. The semiconductor device of claim 10 wherein the same material of the first metal layer and the third metal layer is titanium nitride, tantalum nitride, cobalt, or combinations thereof.

13. The semiconductor device of claim 10 wherein the same material of the second metal layer and the fourth metal layer is titanium, tantalum, aluminum, or combinations thereof.

14. The semiconductor device of claim 1 wherein the NMOS structure is a portion of a SRAM device and the PMOS structure is a portion of a logic device.

15. A device comprising:
an NMOS transistor that includes:
 a first gate dielectric layer disposed over a substrate, and
 a first metal gate disposed over the first gate dielectric layer, wherein the first metal gate has a first work function that results from a combined p-type work function and n-type work function; and
a PMOS transistor that includes:
 a second gate dielectric layer disposed over the substrate, and
 a second metal gate disposed over the second gate dielectric layer, wherein the second metal gate has a second work function that results from a combined p-type work function and n-type work function.

16. The device of claim 15 wherein the first work function and the second work function range from about 4.4 eV to about 4.8 eV.

17. The device of claim 15 wherein the first work function and the second work function are about 4.6 eV.

18. The device of claim 15 wherein the NMOS transistor and the PMOS transistor are a portion of a SRAM cell.

19. The device of claim 18 further including a CMOS cell, wherein the CMOS cell includes:
another NMOS transistor that includes:
 a third gate dielectric layer disposed over a substrate, and
 a third metal gate disposed over the third gate dielectric layer, wherein the third metal gate has a third work function; and
another PMOS transistor that includes:
 a fourth gate dielectric layer disposed over the substrate, and
 a fourth metal gate disposed over the fourth gate dielectric layer, wherein the fourth metal gate has a fourth work function that results from a combined p-type work function and n-type work function.

20. The device of claim 19 wherein:
the first work function is equal to the second work function; and
the third work function is different than the fourth work function.

* * * * *